US008665666B2

(12) United States Patent
Zhou et al.

(10) Patent No.: US 8,665,666 B2
(45) Date of Patent: Mar. 4, 2014

(54) ACOUSTIC APPARATUS AND ACOUSTIC SENSOR APPARATUS INCLUDING A FASTENER

(75) Inventors: Xin Zhou, Franklin Park, PA (US); Robert Yanniello, Asheville, NC (US); Dale L. Gass, Brown Deer, WI (US); Birger Pahl, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 756 days.

(21) Appl. No.: 12/906,259

(22) Filed: Oct. 18, 2010

(65) Prior Publication Data

US 2012/0095706 A1  Apr. 19, 2012

(51) Int. Cl.
*G01R 31/08* (2006.01)

(52) U.S. Cl.
USPC .......................................................... 367/13

(58) Field of Classification Search
USPC .......................................................... 367/13
See application file for complete search history.

(56) References Cited

U.S. PATENT DOCUMENTS

| | | | | |
|---|---|---|---|---|
| 3,094,864 | A * | 6/1963 | Kahkonen et al. | 367/181 |
| 5,521,840 | A * | 5/1996 | Bednar | 702/183 |
| 6,166,997 | A * | 12/2000 | Dussault et al. | 367/154 |
| 6,333,715 | B1 | 12/2001 | Kato et al. | |
| 6,518,772 | B1 * | 2/2003 | Milkovic et al. | 324/551 |
| 7,148,696 | B2 | 12/2006 | Zhou et al. | |
| 7,403,129 | B2 | 7/2008 | Zhou et al. | |
| 7,411,403 | B2 | 8/2008 | Zhou | |
| 8,434,367 | B2 * | 5/2013 | Zhou et al. | 73/645 |
| 8,483,007 | B2 * | 7/2013 | Zhou et al. | 367/13 |
| 2006/0114749 | A1 * | 6/2006 | Baxter et al. | 367/128 |
| 2006/0254355 | A1 * | 11/2006 | Zhou | 73/579 |
| 2012/0090396 | A1 * | 4/2012 | Zhou et al. | 73/645 |
| 2012/0092020 | A1 * | 4/2012 | Zhou et al. | 324/537 |
| 2012/0092965 | A1 * | 4/2012 | Zhou et al. | 367/135 |
| 2012/0095706 | A1 * | 4/2012 | Zhou et al. | 702/58 |
| 2012/0294043 | A1 * | 11/2012 | Juds et al. | 363/15 |
| 2013/0192376 | A1 * | 8/2013 | Zhou et al. | 73/662 |

FOREIGN PATENT DOCUMENTS

| | | |
|---|---|---|
| DE | 2 201 293 A1 | 7/1973 |
| DE | 26 41 047 A1 | 3/1978 |
| FR | 1 181 357 A | 6/1959 |

OTHER PUBLICATIONS

Machine translation of DE2641047.*
Machine translation of FR1181357.*
European Patent Office, "extended European search report", Nov. 28, 2012, 6 pp.

* cited by examiner

*Primary Examiner* — Daniel Pihulic
(74) *Attorney, Agent, or Firm* — Eckert Seamans Cherin & Mellott, LLC; Kirk D. Houser

(57) ABSTRACT

An acoustic sensor apparatus includes a housing, a fastener structured to fasten together the housing and an electrical power conductor, an acoustic sensor structured to detect acoustic noise from the electrical power conductor and output a signal, and a circuit structured to detect an electrical conductivity fault from the signal.

24 Claims, 8 Drawing Sheets

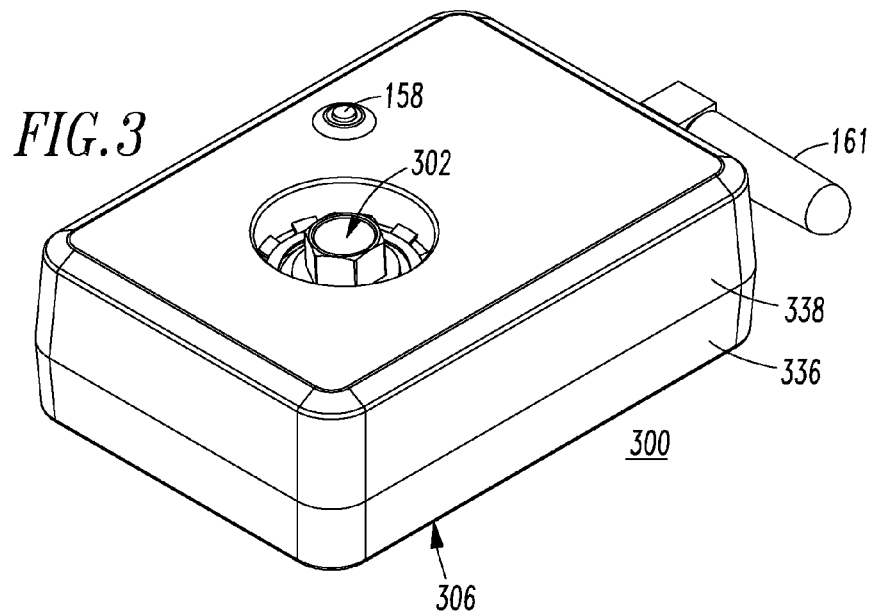
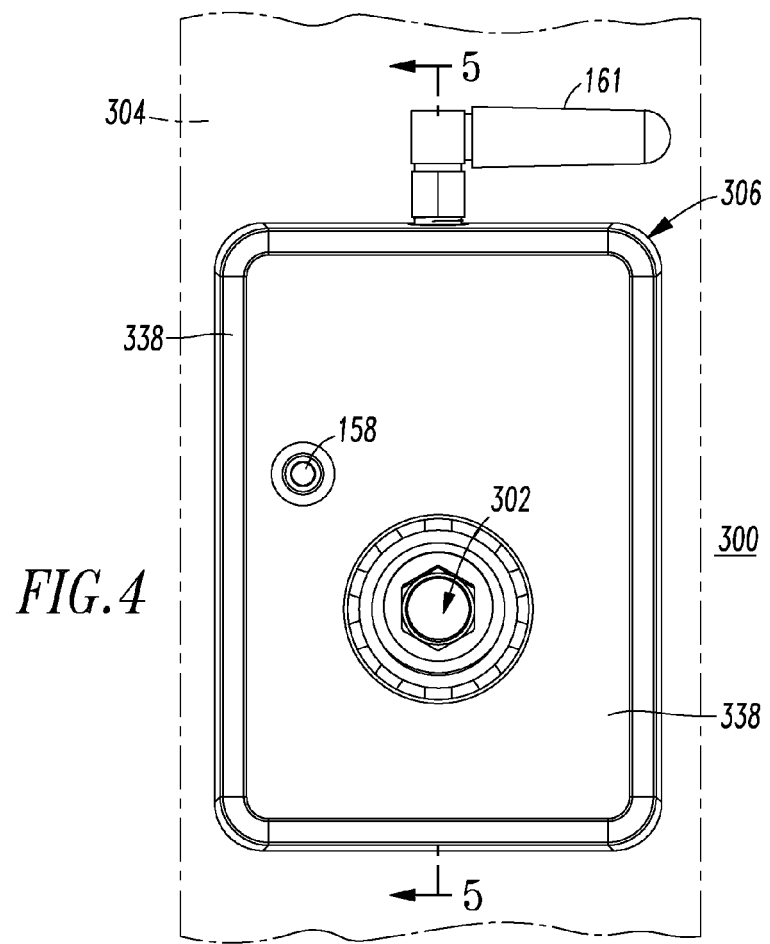

ACOUSTIC APPARATUS AND ACOUSTIC SENSOR APPARATUS INCLUDING A FASTENER

CROSS-REFERENCE TO RELATED APPLICATIONS

This application is related to commonly assigned, U.S. patent application Ser. No. 12/906,244, filed Oct. 18, 2010, (now U.S. Pat. No. 8,483,007, issued Jul. 9, 2013) entitled "ACOUSTIC SENSOR SYSTEM FOR DETECTING ELECTRICAL CONDUCTIVITY FAULTS IN AN ELECTRICAL DISTRIBUTION SYSTEM"; commonly assigned, copending U.S. patent application Ser. No. 12/906,256, filed Oct. 18, 2010, entitled "ACOUSTIC APPARATUS AND ACOUSTIC SENSOR APPARATUS INCLUDING A CLAMP"; and commonly assigned, U.S. patent application Ser. No. 12/906,258, filed Oct. 18, 2010, (now U.S. Pat. No. 8,434,367, issued May 7, 2013) entitled "ACOUSTIC SENSOR SYSTEM, ACOUSTIC SIGNATURE SIMULATOR, AND ELECTRICAL DISTRIBUTION SYSTEM".

BACKGROUND

1. Field

The disclosed concept pertains generally to acoustic noise induced by electrical conductivity faults and, more particularly, to acoustic sensor systems. The disclosed concept also pertains to such acoustic sensor systems, which can also function as acoustic signature simulators for electrical distribution systems.

2. Background Information

There is no known cost effective technology and product to detect loose electrical connections in electrical distribution systems. An infrared imaging scan has been widely used to find such loose electrical connections, but this does not provide continuous (e.g., "24-7" or 24 hours a day, seven days a week) detection and monitoring, is limited to inspection of only exposed joints, and exposes operators to arc flash hazards when opening energized enclosures.

Other known products employ temperature sensing at each electrical joint. However, this has not been widely adopted due to cost.

It is believed to be almost impossible to extract a loose electrical connection signature from both current and voltage due to the relatively small voltage drop across a loose electrical connection (except when this escalates into a major arc fault or arc flash event) except by monitoring voltage drops at each electrical connection.

U.S. Pat. No. 7,148,696 discloses that an acoustic signature is generated by an arc fault or a glowing contact. An acoustic sensor "listens" directly to signature noise generated by a fault, no matter what type of electrical load is present or in what kind of environment in which the fault is generated. The acoustic noise generated by an arc fault or a glowing contact has an acoustic signal at one or more specific wavelengths that is (are) directly related to either the basic characteristics of, for example, the arc and its resonance frequency or the AC power source modulated frequency and its harmonics. The acoustic signal of an arc fault is detected by an acoustic sensor. A resulting trip signal is sent to a trip mechanism to, for example, trip open separable contacts, in order to interrupt the arc fault.

U.S. Pat. No. 7,411,403 discloses a circuit breaker that detects a loose electrical connection condition of a power circuit. The circuit breaker includes first and second lugs, and first and second acoustic couplers acoustically coupled to the power circuit. An acoustic generator is coupled to the second acoustic coupler and generates a first acoustic signal to the power circuit from the second acoustic coupler. An acoustic sensor is coupled to the first acoustic coupler and has a second acoustic signal which is operatively associated with the loose electrical connection condition. The acoustic sensor outputs a sensed acoustic signal. A circuit cooperates with the acoustic generator to generate the first acoustic signal, input the sensed acoustic signal, and detect the loose electrical connection condition therefrom. The circuit can output a trip signal to a trip mechanism upon detecting an electrical conductivity fault from the sensed acoustic signal.

There is a need for a cost effective technology and product to effectively detect loose electrical connections at their earliest stage in order to prevent potential equipment damage and/or personal injury.

There is room for improvement in acoustic apparatus and in acoustic sensor apparatus.

SUMMARY

These needs and others are met by embodiments of the disclosed concept, in which an acoustic apparatus or acoustic sensor apparatus comprises a fastener structured to fasten together a housing and an electrical power conductor.

In accordance with one aspect of the disclosed concept, an acoustic sensor apparatus comprises: a housing; a fastener structured to fasten together the housing and an electrical power conductor; an acoustic sensor structured to detect acoustic noise from the electrical power conductor and output a signal; and a circuit structured to detect an electrical conductivity fault from the signal.

The housing may comprise a through-hole; the fastener may be a bolt passing through the through-hole of the housing; and the bolt may be structured to bolt onto the electrical power conductor.

The bolt may comprise a shaft and a spacer having an arcuate shape; the through-hole may have a conical shape and an arcuate shape; the arcuate shape of the spacer of the bolt may be structured to engage the arcuate shape of the through-hole; and the bolt may be structured to pivot with the shaft of the bolt in the conical shape of the through-hole.

As another aspect of the disclosed concept, an acoustic apparatus for an electrical power conductor comprises: a housing; a fastener structured to fasten together the housing and the electrical power conductor; and at least one of: (a) an acoustic sensor structured to detect acoustic noise from the electrical power conductor and output a signal, and a circuit structured to detect an electrical conductivity fault from the signal, and (b) an acoustic transmitter structured to generate acoustic noise to mimic acoustic noise induced by an electrical conductivity fault.

BRIEF DESCRIPTION OF THE DRAWINGS

A full understanding of the disclosed concept can be gained from the following description of the preferred embodiments when read in conjunction with the accompanying drawings in which:

FIG. 3 is an isometric view of an acoustic sensor apparatus including a fastener for a rectangular power bus bar in accordance with another embodiment of the disclosed concept.

FIG. 4 is a vertical elevation view of the acoustic sensor apparatus of FIG. 3.

DESCRIPTION OF THE PREFERRED EMBODIMENTS

As employed herein, the term "number" shall mean one or an integer greater than one (i.e., a plurality).

As employed herein, the term "acoustic" shall mean one or more sounds that are subsonic, sonic and/or ultrasonic.

As employed herein, the term "electrical power conductor" shall mean a wire (e.g., solid; stranded; insulated; non-insulated), a copper conductor, an aluminum conductor, a suitable metal conductor, an electrical bus bar, or other suitable material or object that permits an electric current to flow easily.

As employed herein, the term "electrical joint" shall mean a structure that electrically and mechanically connects a plurality of electrical conductors.

As employed herein, the term "lug" shall mean a terminal or other electrically conductive fitting to which one or more electrical conductors are electrically and mechanically connected.

As employed herein, the term "electrical conductivity fault" shall mean an arc fault, or a loose or other intermittent electrical connection of an electrical conductor, an electrical joint and/or a lug that leads to a glowing contact.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "acoustic coupler" shall mean an acoustic lug; a clamp; or another suitable coupling mechanism to hold an electrical conductor and an acoustic sensor or an acoustic generator together to allow effective acoustic transmission with or without an electrical connection.

As employed herein, the term "signature" shall mean something that serves to set apart or identify another thing. For example, an acoustic signature serves to set apart or identify an electrical conductivity fault.

As employed herein, the term "clamp" shall mean a device or apparatus having parts brought together to press two or more other parts together so as to hold them firmly, such as by holding or compressing an electrical power conductor and an insulation spacer.

As employed herein, the term "fastener" shall mean rivets, adhesives, screws, bolts and the combinations of bolts and nuts (e.g., without limitation, lock nuts) and bolts, washers and nuts. The term "fastener" expressly excludes a clamp.

As employed herein, the term "bolt" shall mean a device or apparatus structured to bolt two or more parts together so as to hold them firmly, such as by bolting an electrical power conductor and a housing including, for example, an insulation spacer. A bolt can be, for example, a metal rod or pin for fastening objects together that usually has a head at one end and a screw thread at the other end. The bolt may optionally be secured by a nut.

Figure 1:
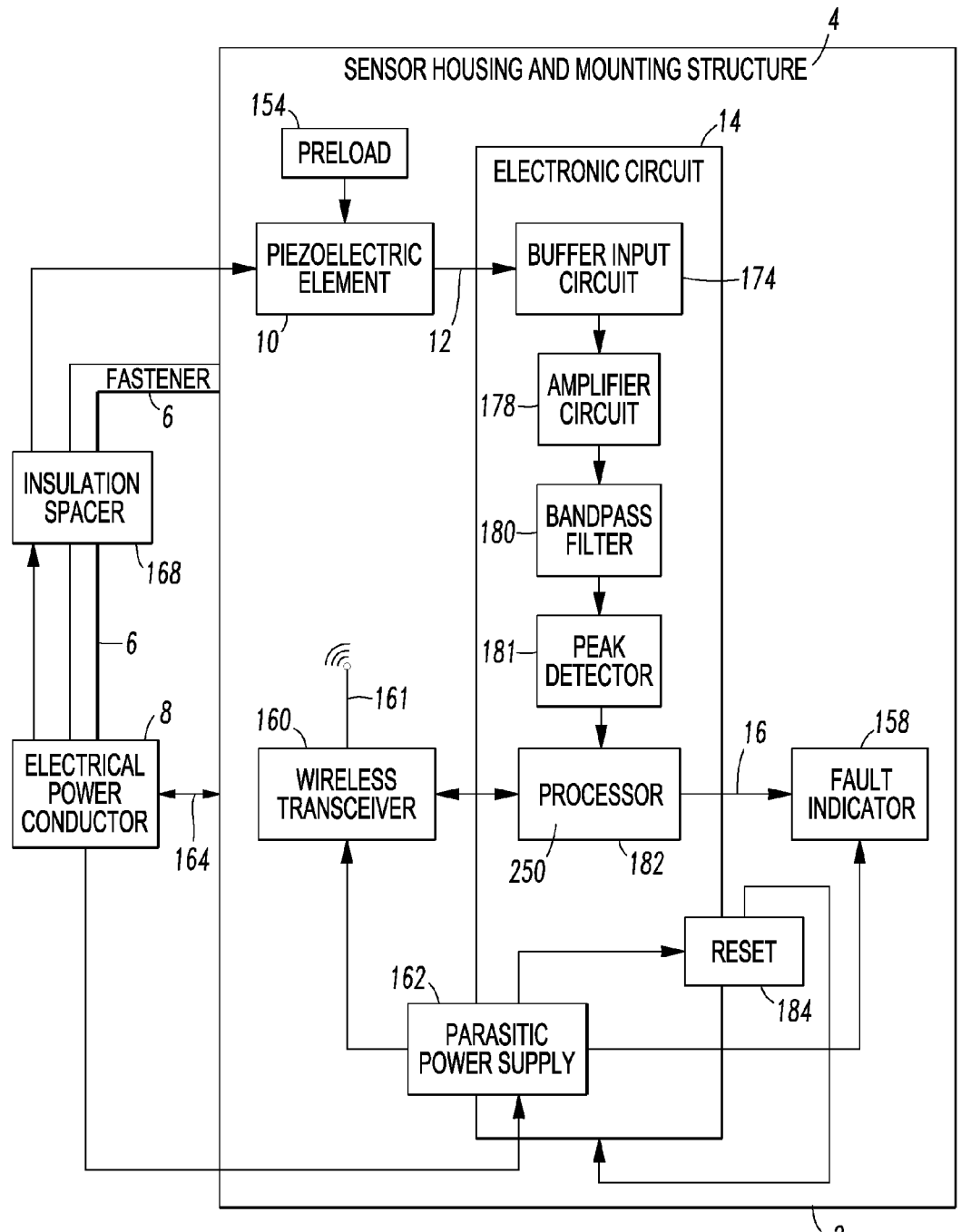
FIG. 1 is a block diagram of an acoustic sensor apparatus in accordance with embodiments of the disclosed concept.

Referring to FIG. 1, an acoustic sensor apparatus 2 includes a housing, such as an example sensor housing and mounting structure 4, a fastener 6 structured to fasten together at least the housing 4 and an electrical power conductor 8, an acoustic sensor, such as the example piezoelectric element 10, structured to detect acoustic noise from the electrical power conductor 8 and output a signal 12, and a circuit, such as an example electronic circuit 14, structured to detect an electrical conductivity fault 16 from the signal 12.

Example 1

The example acoustic sensor apparatus 2 includes the example sensor housing and mounting structure 4, the fastener 6, the example piezoelectric element 10, an optional preload 154, the example electronic circuit 14 that outputs the electrical conductivity fault signal 16, a fault indicator 158, a communication device, such as a wired transceiver, a wired transmitter, a wireless transmitter, or a wireless transceiver 160 including an antenna 161, and a power supply 162.

The preload 154, which is not required, compresses the piezoelectric element 10 under pressure in its assembly. The "preload" means that the piezoelectric element 10 is compressed or under pressure in its assembly. The preload 154, which is applied to the example piezoelectric element 10, can be, for example and without limitation, a compression element such as a loaded compression spring.

The sensor housing and mounting structure 4 is suitably fastened, at 164, to an electrical power conductor 8 (e.g., without limitation, of switchgear (not shown); of an electrical distribution system (not shown)). The example piezoelectric element 10 is coupled to the electrical power conductor 8 by a suitable insulation spacer 168 or through the sensor housing by a suitable insulating spacer (not shown). For example, the sensor housing and mounting structure 4 is fastened (e.g., without limitation, bolted) onto the electrical power conductor 8, such as a bus bar or a cable, in electrical systems (not shown).

Although the power supply 162 is shown as being an example parasitic power supply (e.g., without limitation, employing a current transformer (CT) (not shown, but see the CT 313 and core 314 of FIG. 5) that derives power from the energized electrical power conductor 8), it will be appreciated that a wide range of power supplies can be employed. The example parasitic power supply 162 includes a power harvesting capability such as by employing a number of power CTs (not shown) to harvest electrical power when there is current flowing through the electrical power conductor 8. Alternatively or in addition, power harvesting from the voltage of the electrical power conductor 8 can be employed.

The wireless transceiver 160 provides a suitable wireless communication capability (e.g., without limitation, IEEE 802.11; IEEE 802.15.4; another suitable wireless transceiver or transmitter) to communicate the detection of an electrical conductivity fault to another location (e.g., without limitation, a remote device, such as a control center (not shown); a control console (not shown); a trip unit (not shown); a protective relay (not shown), at a remote location) to alert maintenance personnel of the fault and its zone location.

The electronic circuit 14 includes a buffer input circuit 174 that receives the output signal 12 (e.g., an acoustic signal) from the piezoelectric element 10, an amplifier circuit 178, a bandpass filter 180, a peak detector 181 and a processor 182. A reset circuit 184 can reset the electronic circuit 14 after a power outage caused by the parasitic power supply 162 receiving insufficient power from the electrical power conductor 8.

The piezoelectric element 10 senses acoustic signals propagating through the electrical power conductor 8, and outputs the signal 12 to the buffer input circuit 174, which outputs a voltage signal to the amplifier circuit 178. The voltage signal is amplified by the amplifier circuit 178 that outputs a second signal. The second signal can be filtered by the bandpass filter 180 and input by the peak detector 181 that detects a peak signal and outputs that as a third signal. The third signal is analyzed by a routine 250 of the processor 182, in order to detect the electrical conductivity fault therefrom. This determines if an electrical conductivity fault, such as a glowing contact, exists. The piezoelectric element 10 can optionally be preloaded with a predetermined pressure to maximize its output. The parasitic power supply 162 powers the electronics of the acoustic sensor apparatus 2.

Example 2

Figure 2A:
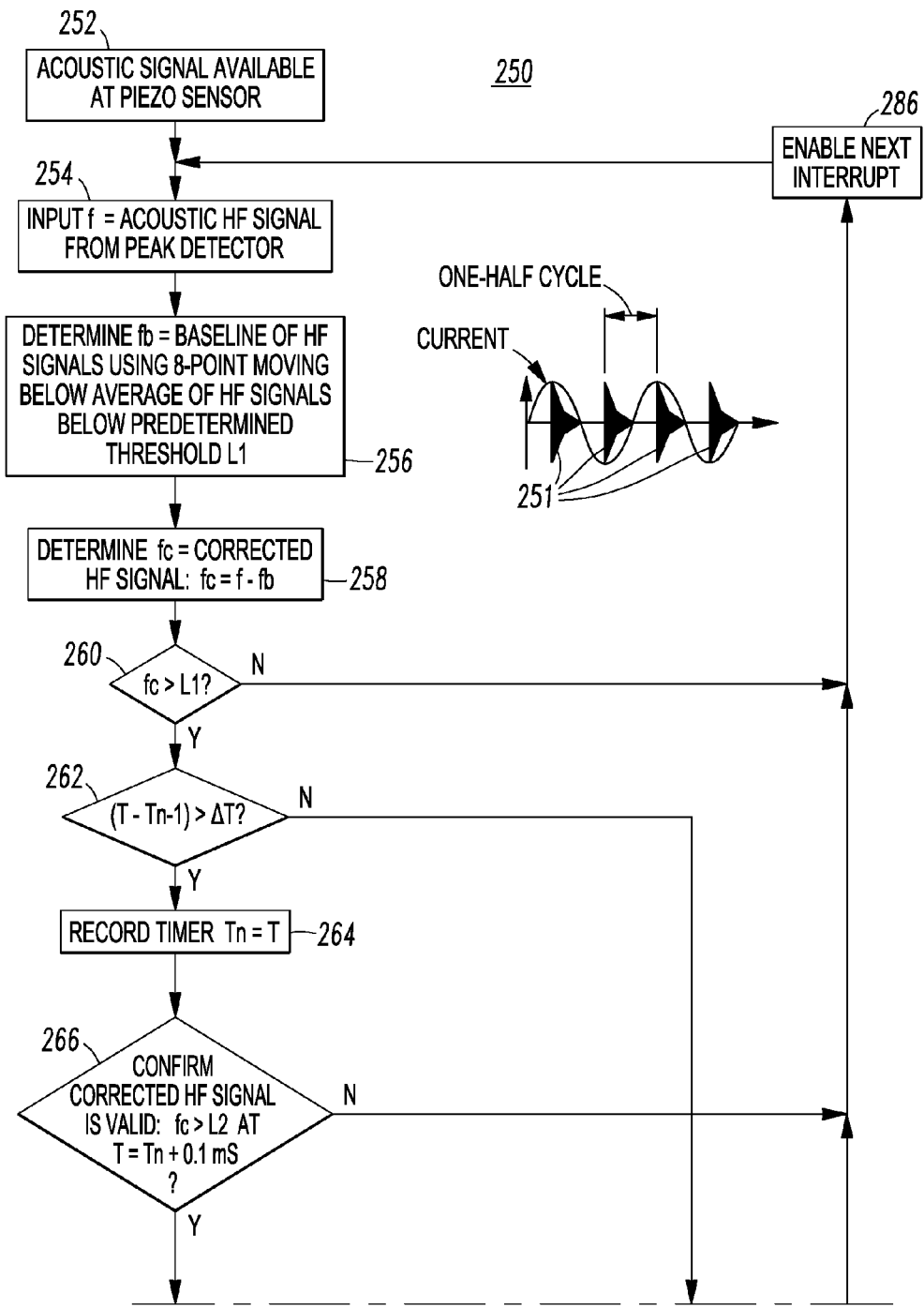
FIGS. 2A and 2B form a flowchart of a routine for the processor of FIG. 1.
Figure 2B:
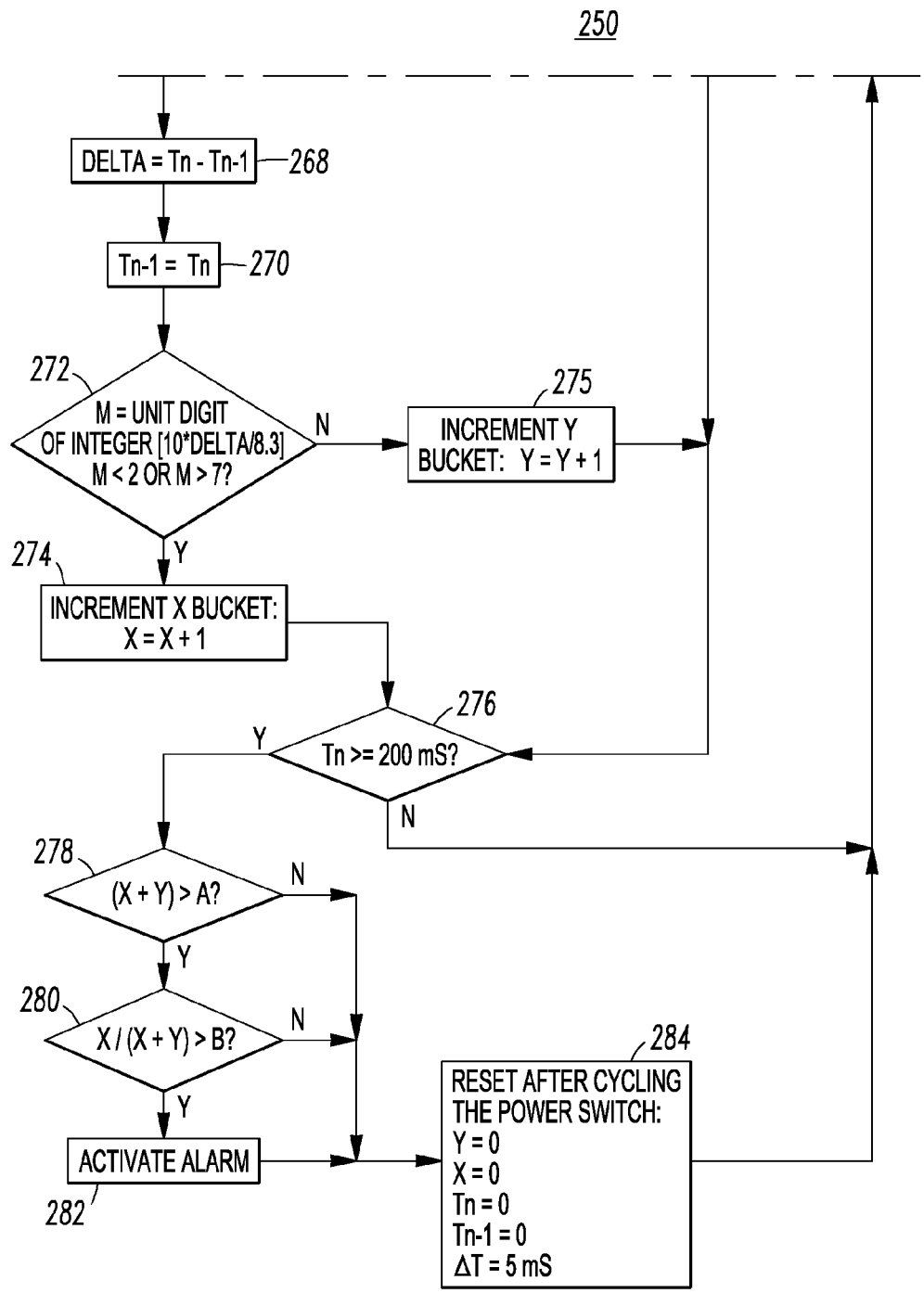

Referring to FIGS. 2A-2B, the routine 250 for the processor 182 of FIG. 1 is shown. The general operation of this routine 250 is to obtain output from the peak detector 181 of FIG. 1 and measure DELTA (step 268), the time difference between two adjacent signals from the peak detector 181. First, at 252, an acoustic signal is available at the piezoelectric element 10 and the peak acoustic signal therefrom is available at the peak detector 181. Next, at 254, the routine 250 inputs a signal, f, which is the acoustic high frequency (HF) signal from the peak detector 181.

Then, at 256, a value, fb, is determined, which is the baseline of the HF signals using, for example, an 8-point moving average of the HF signals below a predetermined threshold L1. Two L1 and L2 thresholds are employed by the routine 250 to confirm that acoustic wavelets 251 have the intended profile representative of an electrical conductivity fault. Non-limiting examples of L1 and L2 are 100 mV and 50 mV, respectively. Sometimes, the HF signal from the peak detector 181 has a relatively high noise level due to various reasons such as, for example, increased EMI noise. In order to avoid the effect of baseline noise level variation, step 256 seeks to take the noise level out of the measured signal by estimating the noise level using the example 8-point moving average on those HF signals below the predetermined threshold L1. The example 8-point moving average is the average value of the last example eight samples whose values are below the L1 threshold. Next, at 258, the corrected HF signal, fc, is determined from f−fb.

At 260, it is determined if fc is greater than L1. If so, then it is determined if T−Tn−1 is greater than ΔT (e.g., a predefined value such as 5 mS) at 262. T is the time from a suitable timer (not shown) (e.g., without limitation, an oscillator circuit (not shown) in the processor 182 of FIG. 1; a crystal oscillator (not shown) in the processor 182). DELTA is reset to zero at 284 (where Tn=Tn−1=0) after the routine 250 reaches its predetermined time period at 276. If the test passes at 262, then at 264, the timer value, T, is recorded as Tn. Tn=T means that time T is recorded as Tn when there is an acoustic signal coming out of the peak detector 181 that is higher than the L1 threshold. Next, step 266 confirms that the corrected HF signal is valid if fc is greater than L2 at T=Tn+0.1 mS. If so, then variable DELTA is set equal to Tn−Tn−1. Then, at 270, Tn−1 is set equal to Tn.

Next, at 272, it is determined if M is less than 2 or greater than 7, where M is the unit digit of integer [10*DELTA/8.3333]. This checks if DELTA is a multiple of 8.3333 mS (e.g., without limitation, DELTA/8.3333=2.1, then (DELTA/8.3333)×10=21, and M=1 which is less than 2. So DELTA in this case can be considered as a multiple of 8.3333 mS considering the potential measurement error. Effectively, step 272 determines if DELTA is a multiple of one-half line cycle (e.g., without limitation, about 8.3 mS). M represents the digit after the digit point, such as, for example, M=2 for 3.24 or M=8 for 5.82. If the test passes at 272 and DELTA is a multiple of one-half line cycle, then, at 274, one is added to an X bucket. On the other hand, if DELTA is not a multiple of one-half line cycle, then, at 275, one is added to a Y bucket.

After steps 274 or 275, or if the test failed at 262, then at 276, it is determined if Tn is greater than or equal to a predetermined time (e.g., without limitation, 200 mS; 2 S; 10 S; one day). If so, then at 278 and 280, the routine 250 checks two criteria before it declares that the noise is induced by an electrical conductivity fault, such as a glowing contact. Step 278 checks if X+Y>=A (e.g., without limitation, 10; 15; any suitable value); and step 280 checks if the ratio of X/(X+Y) >B (e.g., without limitation, 60%; any suitable percentage less than 100%). If these two tests pass, then an alarm (e.g., the fault indicator 158 of FIG. 1) is activated at 282. Otherwise, if one or both of these two tests fail, or after 282, the routine 250 causes a reset after cycling of power (e.g., if power from the power supply 162 of FIG. 1 cycles; if a manual power switch (not shown) is cycled), then values Y, X, Tn and Tn−1 are reset to zero and ΔT is set to 5 mS at 284, and the next interrupt is enabled at 286. Step 286 is also executed if any of the tests fail at 260, 266 and/or 276. Interrupts occur periodically (e.g., without limitation, every 100 μS). Also, the X and Y buckets of respective steps 274 and 275 are reset to zero after a predetermined time (e.g., without limitation, 10,000 mS; any suitable time).

The example routine 250 is similar to those of U.S. Pat. No. 7,148,696. However, it adds various features such as, for example, the L2 threshold in order to confirm that the wavelet contour is correct for each acoustic signal.

Example 3

Figure 5:
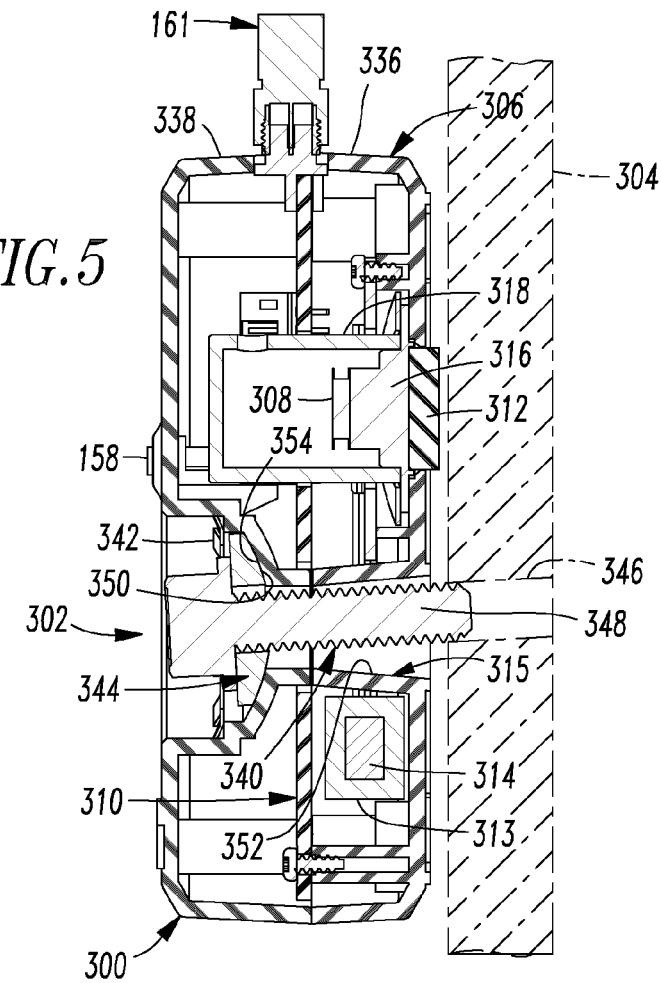
FIG. 5 is a cross-sectional view along lines 5-5 of FIG. 4.
Figure 6:
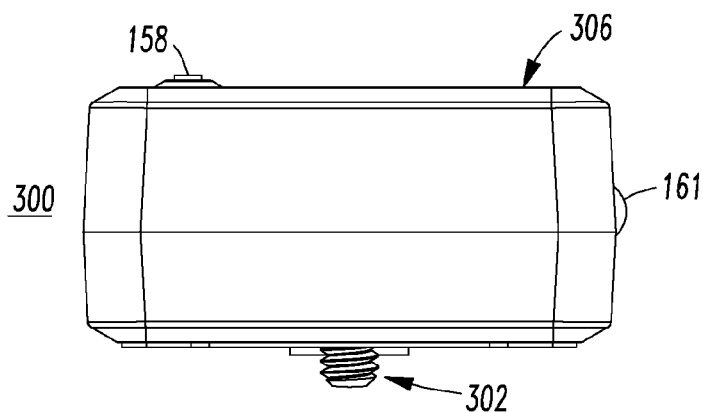
FIG. 6 is an end elevation view of the acoustic sensor apparatus of FIG. 3.

Referring to FIGS. 3-7, an acoustic sensor apparatus 300 includes a fastener, such as the example fastener structure 302, for an electrical power conductor, such as the example rectangular power bus bar 304 (shown in phantom line drawing in FIGS. 4 and 5). The example acoustic sensor apparatus 300 also includes a housing 306 for an acoustic sensor and/or an acoustic generator, such as a low cost piezoelectric element 308 (shown in FIG. 5) housed within the housing 306, and a printed circuit board (PCB) 310 (FIG. 5), which can include the example electronic circuit 14, fault indicator 158, wireless transceiver 160, parasitic power supply 162 and reset circuit 184 of FIG. 1. The housing 306 is fastened onto power bus bar 304 or another suitable power conductor (not shown) in an electrical system (not shown) by the fastener structure 302.

Example 4

As shown in FIG. 5, the exterior of the housing 306 includes an insulation spacer 312, which is coupled to a stainless steel base 316 fitted to a stainless steel cylindrical canister 318 wherein piezoelectric element 308 is disposed. The fastener structure 302 is structured to fasten together the insulation spacer 312 (e.g., a ceramic disk) and the example power bus bar 304 along with the housing 306. The piezoelectric element 308 is within the example 0.5" diameter stainless steel cylindrical canister 318 and is coupled to the stainless steel base 316 opposite the insulation spacer 312.

The canister 318 can be secured within the housing by, for example and without limitation, fasteners (not shown) and a leaf spring (not shown).

Example 5

The housing 306 can be, for example and without limitation, a metallic housing or an insulative housing having an internal and/or external metal coating structured to provide EMI shielding.

Example 6

The metal coating can be, for example and without limitation, a suitable thin film metal coating.

Example 7

Figure 7:
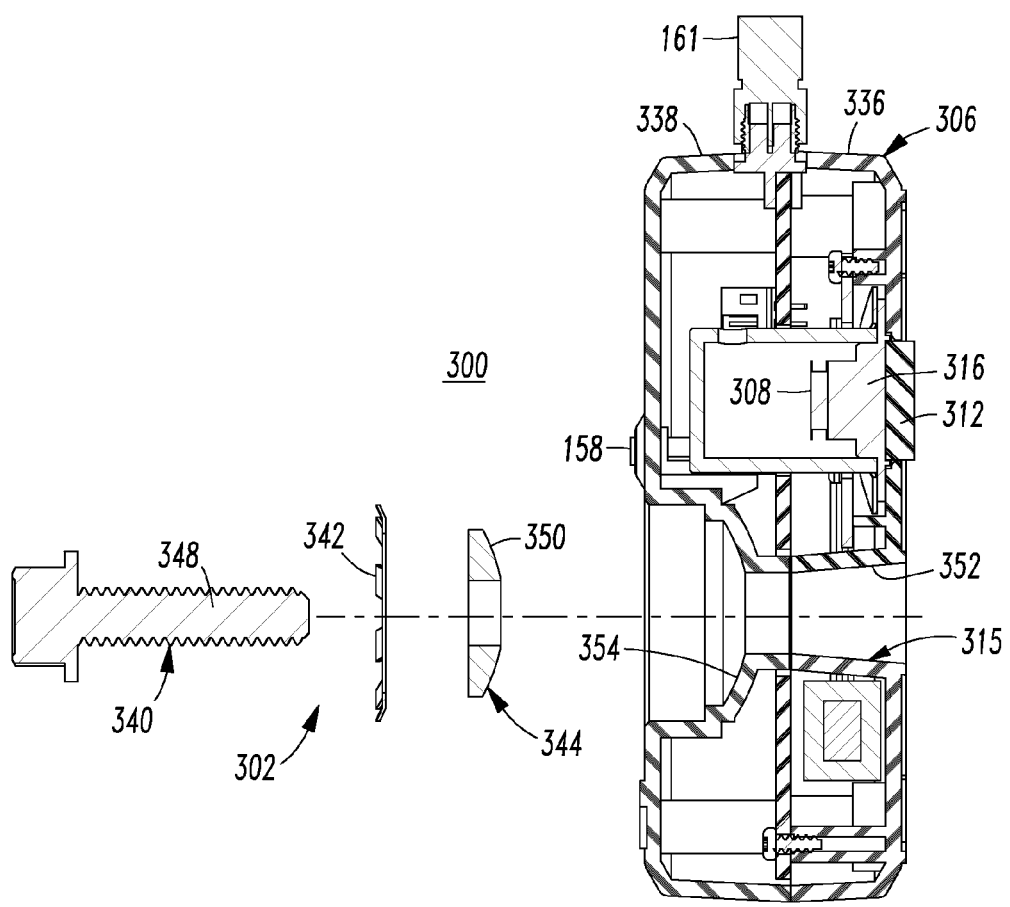
FIG. 7 is a partially exploded view of the acoustic sensor apparatus of FIG. 5.

As is best shown in FIG. 5, the example fastener structure 302 is disposed through opening 315 of the housing 306. As is best shown in FIG. 7, the example fastener structure 302 includes a bolt 340, a lockwasher 342 and a suitably shaped spacer 344. As shown in FIG. 5, the lockwasher 342 holds the bolt 340 and shaped spacer 344 in place, but still allows them to pivot, in order to advantageously accommodate a tapped hole 346 in the electrical power conductor 304, which might not be perfectly normal thereto.

As shown in FIGS. 5 and 7, bolt 340 includes a shaft 348 and the shaped spacer 344 has an arcuate shape 350. The opening 315 is a through-hole having both a conical shape 352 and an arcuate shape 354. The arcuate shape 350 of the shaped spacer 344 is structured to engage the arcuate shape 354 of the through-hole 315, in order that the bolt 340 is structured to pivot with the bolt shaft 348 being in the conical shape 352 of the through-hole 315 as shown in FIG. 5.

Example 8

As shown in FIGS. 3-7, the example acoustic sensor apparatus 300 includes the fault indicator 158 of FIG. 1, which can be an LED indicator (e.g., without limitation, green flashing for normal operation; red flashing for detection of an electrical conductivity fault operatively associated with the power bus bar 304). An optional on/off switch (not shown) can enable or disable the power supply 162 of FIG. 1, which can optionally include a battery (not shown).

Example 9

As can be seen from FIGS. 3-7, the example housing 306 includes a base 336 and a cover 338. The antenna 161 protrudes from the housing 306. The housing 306 has the opening 315 therethrough, and the fastener structure 302 is disposed through this opening. The fastener structure 302 comprises the bolt 340 structured to fasten together the housing 306 and the rectangular power bus bar 304. The housing 306 includes the insulation spacer 312, and the fastener structure 302 is further structured to fasten together the insulation spacer 312 and the bus bar 304.

Example 10

Figure 8:
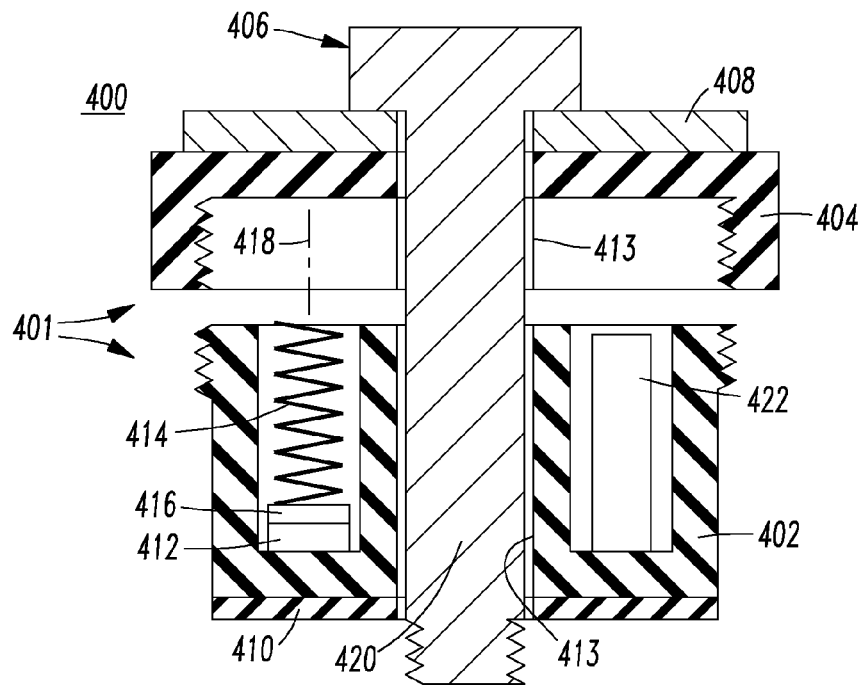
FIGS. 8-11 are partially exploded cross-sectional views of acoustic sensor apparatus in accordance with other embodiments of the disclosed concept.
Figure 9:
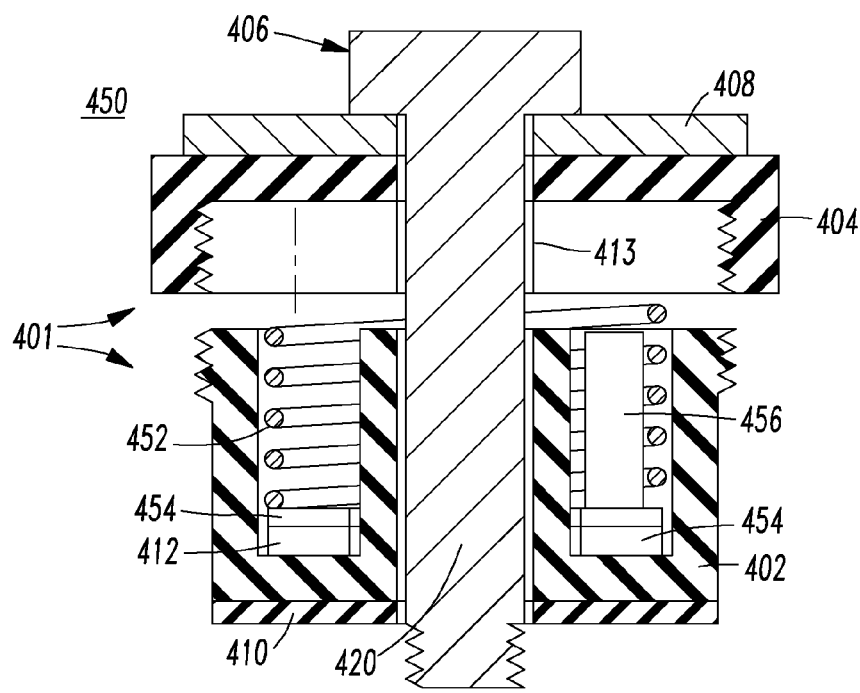

FIGS. 8 and 9 show example acoustic sensor apparatus 400 and 450, respectively, which include a housing 401 formed by a base 402 and a cover 404, a bolt 406, a washer 408, an insulation spacer, such as the example ceramic insulator 410, and a piezoelectric element 412. The bolt 406 goes through the sensor housing 401, which includes a through-hole 413. In turn, the bolt 406 is suitably structured to bolt onto an electrical power conductor (not shown, but see the electrical power conductor 304 of FIG. 4).

As is shown with the acoustic sensor apparatus 400 of FIG. 8, a preload is applied to the example piezoelectric element 412 by a compression element, such as the example loaded compression spring 414, which engages the cover 404 at one end and a suitable spacer 416 at the other end. Hence, the spring 414 and spacer 416 apply the preload to the piezoelectric element 412.

In this example, the spring 414 is a relatively small spring with a diameter similar to that of the piezoelectric element 412 and spacer 416. The preload spring 414 is disposed on the side of the bolt 406, with the longitudinal axis 418 of the spring 414 being disposed parallel to the longitudinal shaft 420 of the bolt 406. An electronic circuit 422 can be disposed on the opposite side of the base 402 with respect to the spring 414, piezoelectric element 412 and spacer 416. Preferably, the latter components can occupy a relatively small portion (e.g., without limitation, about 40° of a total 360° cylindrical base) of the base 402. The electronic circuit 422 can be, for example and without limitation, the circuit 14 of FIG. 1.

Example 11

As is shown with the acoustic sensor apparatus 450 of FIG. 9, a preload is applied to the example piezoelectric element 412 by a compression element, such as the example loaded compression spring 452, which engages the cover 404 at one end and a suitable spacer 454 at the other end. Hence, the spring 452 and spacer 454 apply the preload to the piezoelectric element 412. Here, the relatively larger preload spring 452 (with respect to the preload spring 414 of FIG. 8) goes around the shaft 420 of the bolt 406. An electronic circuit 456 can be disposed on the opposite side of the base 402 from the piezoelectric element 412, which, preferably, can occupy a relatively small portion (e.g., without limitation, about 40° of a total 360° cylindrical base) of the base 402.

Example 12

Figure 10:
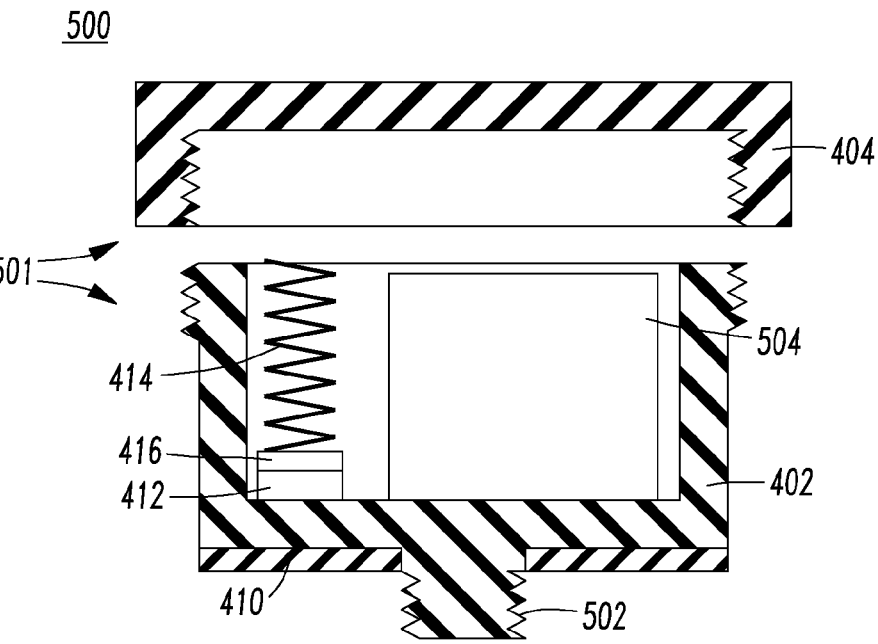
Figure 11:
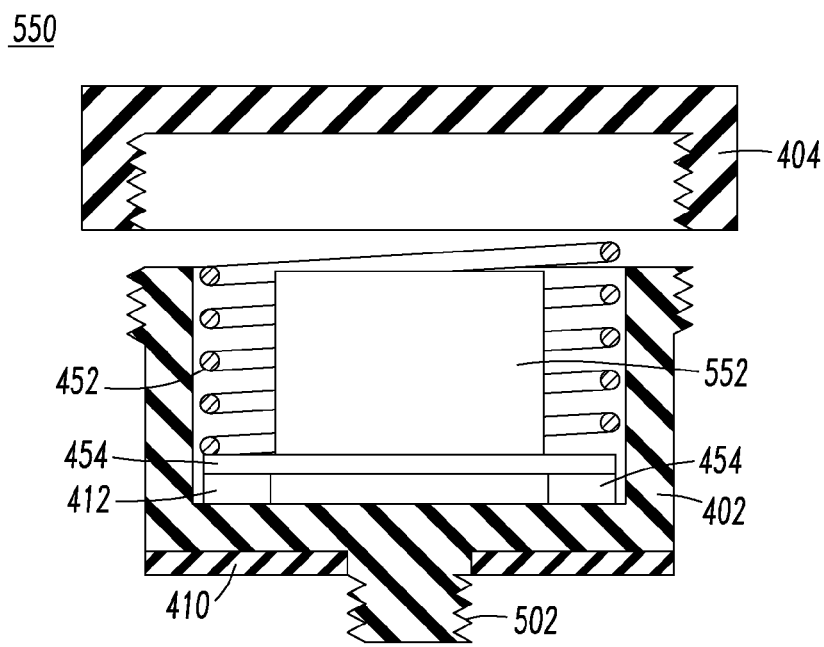

FIGS. 10 and 11 show example acoustic sensor apparatus 500 and 550, respectively, which include some of the same components that were discussed above in connection with FIGS. 8 and 9. Here, however, the fastener is a threaded member 502. The housing 501, as formed by the base 402 and the cover 404, and the threaded member 502 are integrated into one piece. This permits, for example, the entire housing 501 to be rotated in order to fasten it onto an electrical power conductor (not shown, but see the electrical power conductor 304 of FIG. 4). As shown in FIG. 10, the housing 501 houses an electronic circuit 504, the preload spring 414, the spacer 416 and the piezoelectric element 412. The preload spring 414, spacer 416 and piezoelectric element 412 are disposed beside the electronic circuit 504 within the housing 501.

Example 13

FIG. 11 shows the acoustic sensor apparatus 550 in which the relatively larger preload spring 452 (with respect to the preload spring 414 of FIGS. 8 and 10) goes around an electronic circuit 552. The spacer 454 separates the piezoelectric element 412 from the electronic circuit 552 and the spring 452, which engages the spacer 454 that, in turn, engages the piezoelectric element 412.

The disclosed concept can sense a loose connection or other electrical conductivity fault, and can include a suitable acoustic generator, such as a high voltage pulsar circuit, to generate a simulated acoustic signal. This allows it to be used as an acoustic signal generator or acoustic transmitter for optimizing sensor distribution in electrical distribution systems, such as switchgear, in factories or on site. For example, when the piezoelectric element 308 experiences stress and strain, it generates a voltage output. In this case, it is employed as a sensor. When a voltage is applied across the piezoelectric element 308, the dimension of the piezoelectric element changes. This characteristic can be used as an acoustic transmitter or generator.

The example fastener structure 302 can allow for permanent or temporary installation.

The disclosed concept can be employed in association with, for example and without limitation, three-phase switchgear, such as low voltage switchgear, low voltage switch boards, low voltage panel boards, motor control centers and medium voltage switchgear. However, it will be appreciated that the disclosed concept can be employed with a wide range of other applications, such as busway electrical systems for commercial or industrial facilities, aerospace applications, and electric vehicle applications. Also, the disclosed concept is not limited to three-phase applications and can be applied to residential or other single-phase applications. In residential applications, the acoustic signal has a relatively high attenuation rate with relatively small electrical conductors; hence, each acoustic sensor can cover only a relatively short range of the electrical wiring system. For example, each phase can employ a separate sensor. So, for instance, for a three-phase system, there are three sensors.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An acoustic sensor apparatus comprising:
   a housing;
   a fastener structured to fasten together said housing and an electrical power conductor selected from the group consisting of a non-insulated wire, a copper conductor, an aluminum conductor, a metal conductor and an electrical bus bar;
   an acoustic sensor structured to detect acoustic noise from said electrical power conductor and output a signal; and
   a circuit structured to detect an electrical conductivity fault from the signal.

2. The acoustic sensor apparatus of claim 1 wherein a preload is applied to the acoustic sensor by a compression element.

3. The acoustic sensor apparatus of claim 2 wherein the compression element is a loaded compression spring.

4. The acoustic sensor apparatus of claim 1 wherein said housing is a metallic housing or an insulative housing having a metal coating structured to provide EMI shielding.

5. The acoustic sensor apparatus of claim 4 wherein said metal coating is a thin film coating.

6. The acoustic sensor apparatus of claim 1 wherein said housing has an opening therethrough; and wherein said fastener is disposed through the opening of said housing.

7. The acoustic sensor apparatus of claim 6 wherein said electrical power conductor is said electrical bus bar; and wherein said fastener comprises a bolt structured to fasten together said housing and said electrical bus bar.

8. The acoustic sensor apparatus of claim 1 wherein said circuit comprises a communication device structured to communicate with a remote device upon detection of the electrical conductivity fault.

9. The acoustic sensor apparatus of claim 8 wherein said communication device is a wireless transmitter or a wireless transceiver.

10. The acoustic sensor apparatus of claim 1 wherein said circuit is powered by a parasitic power supply to harvest electrical power when there is current flowing through the electrical power conductor.

11. The acoustic sensor apparatus of claim 10 wherein said parasitic power supply comprises a current transformer.

12. The acoustic sensor apparatus of claim 1 wherein said acoustic sensor is a piezoelectric element.

13. The acoustic sensor apparatus of claim 1 wherein said electrical conductivity fault is a glowing contact.

14. An acoustic sensor apparatus comprising:
   a housing;
   a fastener structured to fasten together said housing and an electrical power conductor;
   an acoustic sensor structured to detect acoustic noise from said electrical power conductor and output a signal; and
   a circuit structured to detect an electrical conductivity fault from the signal,
   wherein said housing includes an insulation spacer; and wherein said fastener is further structured to fasten together said insulation spacer and said electrical power conductor.

15. The acoustic sensor apparatus of claim 1 wherein said acoustic sensor is further structured to generate an acoustic signal to mimic acoustic noise induced by an electrical conductivity fault.

16. An acoustic sensor apparatus comprising:
   a housing;
   a fastener structured to fasten together said housing and an electrical power conductor;
   an acoustic sensor structured to detect acoustic noise from said electrical power conductor and output a signal; and
   a circuit structured to detect an electrical conductivity fault from the signal,
   wherein said signal is a first signal; and wherein said circuit comprises:
   an amplifier structured to amplify the first signal and output a second signal;
   a peak detector structured to input the second signal and output a third signal; and
   a processor structured to process the third signal and detect the electrical conductivity fault therefrom.

17. The acoustic sensor apparatus of claim 1 wherein said housing comprises a through-hole; wherein said fastener is a bolt passing through the through-hole of said housing; and wherein said bolt is structured to bolt onto said electrical power conductor.

18. An acoustic sensor apparatus comprising:
   a housing;
   a fastener structured to fasten together said housing and an electrical power conductor;
   an acoustic sensor structured to detect acoustic noise from said electrical power conductor and output a signal; and
   a circuit structured to detect an electrical conductivity fault from the signal, wherein said housing comprises a through-hole; wherein said fastener is a bolt passing through the through-hole of said housing; and wherein said bolt is structured to bolt onto said electrical power conductor, wherein said bolt comprises a shaft; wherein said housing houses a compression element applying a preload to said acoustic sensor; and wherein said compression element is disposed parallel to the shaft of said bolt.

19. An acoustic sensor apparatus comprising:
a housing;
a fastener structured to fasten together said housing and an electrical power conductor;
an acoustic sensor structured to detect acoustic noise from said electrical power conductor and output a signal; and
a circuit structured to detect an electrical conductivity fault from the signal,
wherein said housing comprises a through-hole; wherein said fastener is a bolt passing through the through-hole of said housing; and wherein said bolt is structured to bolt onto said electrical power conductor,
wherein said bolt comprises a shaft; wherein said housing houses a compression element applying a preload to said acoustic sensor; and wherein said compression element is disposed around the shaft of said bolt.

20. An acoustic sensor apparatus comprising:
a housing;
a fastener structured to fasten together said housing and an electrical power conductor;
an acoustic sensor structured to detect acoustic noise from said electrical power conductor and output a signal; and
a circuit structured to detect an electrical conductivity fault from the signal,
wherein said housing comprises a through-hole; wherein said fastener is a bolt passing through the through-hole of said housing; and wherein said bolt is structured to bolt onto said electrical power conductor,
wherein said bolt comprises a shaft and a spacer having an arcuate shape; wherein said through-hole has a conical shape and an arcuate shape; wherein the arcuate shape of the spacer of said bolt is structured to engage the arcuate shape of said through-hole; and wherein said bolt is structured to pivot with the shaft of said bolt in the conical shape of said through-hole.

21. The acoustic sensor apparatus of claim 1 wherein said fastener is a threaded member; and wherein said housing and said threaded member are integrated into one piece.

22. The acoustic sensor apparatus of claim 21 wherein said housing houses said circuit and a compression element applying a preload to said acoustic sensor; and wherein said compression element and said acoustic sensor are disposed beside said circuit within said housing.

23. An acoustic sensor apparatus comprising:
a housing;
a fastener structured to fasten together said housing and an electrical power conductor;
an acoustic sensor structured to detect acoustic noise from said electrical power conductor and output a signal; and
a circuit structured to detect an electrical conductivity fault from the signal,
wherein said fastener is a threaded member;
wherein said housing and said threaded member are integrated into one piece;
wherein said housing houses said circuit, a spacer and a compression element structured to apply a preload to said acoustic sensor; wherein said compression element is disposed around said circuit; wherein said spacer separates said acoustic sensor from said circuit and said compression element; and wherein said compression element engages said spacer, which engages said acoustic sensor.

24. An acoustic apparatus for an electrical power conductor, said acoustic apparatus comprising:
a housing;
a fastener structured to fasten together said housing and said electrical power conductor; and
at least one of:
(a) an acoustic sensor structured to detect acoustic noise from said electrical power conductor and output a signal, and a circuit structured to detect an electrical conductivity fault from the signal, and
(b) an acoustic transmitter structured to generate acoustic noise to mimic acoustic noise induced by an electrical conductivity fault.

* * * * *